United States Patent
Holeyannavar et al.

(10) Patent No.: US 12,142,500 B2
(45) Date of Patent: Nov. 12, 2024

(54) SIDE STORAGE PODS, EQUIPMENT FRONT END MODULES, AND METHODS FOR PROCESSING SUBSTRATES

(71) Applicant: Applied Materials, Inc., Santa Clara, CA (US)

(72) Inventors: Devendra Channappa Holeyannavar, Bangalore (IN); Sandesh Doddamane Ramappa, Bangalore (IN); Dean C. Hruzek, Cedar Park, TX (US); Michael R. Rice, Pleasanton, CA (US); Jeffrey A. Brodine, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/116,759

(22) Filed: Mar. 2, 2023

(65) Prior Publication Data
US 2023/0207354 A1    Jun. 29, 2023

Related U.S. Application Data

(63) Continuation of application No. 17/080,595, filed on Oct. 26, 2020, now Pat. No. 11,621,182, which is a continuation of application No. 16/411,009, filed on May 13, 2019, now Pat. No. 10,847,390, which is a
(Continued)

(51) Int. Cl.
*H01L 21/67* (2006.01)
*H01L 21/673* (2006.01)
*H01L 21/677* (2006.01)

(52) U.S. Cl.
CPC .. *H01L 21/67178* (2013.01); *H01L 21/67184* (2013.01); *H01L 21/6719* (2013.01); *H01L 21/67196* (2013.01); *H01L 21/67201* (2013.01); *H01L 21/67379* (2013.01); *H01L 21/67389* (2013.01); *H01L 21/67769* (2013.01); *H01L 21/67775* (2013.01); *H01L 21/67207* (2013.01)

(58) Field of Classification Search
CPC ......... H01L 21/67178; H01L 21/67201; H01L 21/6719; H01L 21/67184; H01L 21/67393
See application file for complete search history.

(56) References Cited

U.S. PATENT DOCUMENTS 6,199,604 B1    3/2001   Miyajima
6,704,998 B1    3/2004   Bonora
6,955,197 B2    10/2005  Elliott
(Continued)

FOREIGN PATENT DOCUMENTS

CN    103035551 A    4/2013
CN    106684023 A    5/2017
(Continued)

OTHER PUBLICATIONS

Taiwan Search Report of Taiwan Application No. 10781307327 (25135-GTW) dated Mar. 6, 2019.
(Continued)

*Primary Examiner* — Kaitlin S Joerger
(74) *Attorney, Agent, or Firm* — Lowenstein Sandler LLP

(57) ABSTRACT

A platform is of a side storage pod. The platform includes an upper surface and kinematic pins extending from the upper surface within a chamber of the side storage pod to engage a lower surface of a side storage container in the chamber to level the side storage container in the chamber.

20 Claims, 8 Drawing Sheets

Related U.S. Application Data continuation of application No. 15/632,074, filed on Jun. 23, 2017, now Pat. No. 10,388,547.

(56) References Cited

U.S. PATENT DOCUMENTS

| | | | |
|---|---|---|---|
| 7,077,173 B2* | 7/2006 | Tokunaga | H01L 21/67393 |
| | | | 141/98 |
| 7,654,291 B2 | 2/2010 | Miyajima | |
| 8,382,088 B2* | 2/2013 | Kondoh | H01L 21/67769 |
| | | | 269/21 |
| 9,105,673 B2 | 8/2015 | Babbs | |
| 10,388,547 B2 | 8/2019 | Holeyannavar | |
| 2003/0031537 A1 | 2/2003 | Tokunaga | |
| 2006/0045663 A1 | 3/2006 | Aggarwal et al. | |
| 2006/0207680 A1* | 9/2006 | Takamura | H01L 21/67201 |
| | | | 141/98 |
| 2007/0051312 A1* | 3/2007 | Sneh | H01L 21/67748 |
| | | | 156/345.31 |
| 2008/0056860 A1 | 3/2008 | Natume | |
| 2008/0236487 A1 | 10/2008 | Hirano | |
| 2009/0087289 A1 | 4/2009 | Osada | |
| 2010/0038283 A1 | 2/2010 | Chiu | |
| 2010/0040441 A1* | 2/2010 | Obikane | H01L 21/67772 |
| | | | 414/222.01 |
| 2010/0102030 A1 | 4/2010 | Kondoh | |
| 2010/0178147 A1 | 7/2010 | Kremerman | |
| 2010/0182586 A1 | 7/2010 | Ogura | |
| 2012/0083918 A1 | 4/2012 | Yamazaki | |
| 2012/0237323 A1 | 9/2012 | Sugawara | |
| 2012/0241032 A1 | 9/2012 | Sugawara | |
| 2012/0247671 A1 | 10/2012 | Sugawara | |
| 2014/0048208 A1* | 2/2014 | Kim | H01L 21/67207 |
| | | | 156/345.31 |
| 2014/0209024 A1 | 7/2014 | Kim | |
| 2015/0045961 A1 | 2/2015 | Koshti | |
| 2015/0107770 A1 | 4/2015 | Choi | |
| 2015/0170945 A1 | 6/2015 | Segawa | |
| 2015/0364346 A1* | 12/2015 | Woo | H01L 21/67393 |
| | | | 15/405 |
| 2016/0035596 A1* | 2/2016 | Kamiya | H01L 21/67736 |
| | | | 414/225.01 |
| 2016/0118279 A1 | 4/2016 | Iyer | |
| 2016/0118282 A1 | 4/2016 | Maraschin | |
| 2016/0147235 A1 | 5/2016 | Rice | |
| 2016/0284580 A1 | 9/2016 | Woo | |
| 2016/0351427 A1* | 12/2016 | Murata | B08B 9/08 |
| 2016/0358799 A1* | 12/2016 | Murata | H01L 21/67393 |
| 2017/0011942 A1 | 1/2017 | Woo | |
| 2017/0025290 A1* | 1/2017 | Wakabayashi | H01L 21/67772 |
| 2017/0037294 A1 | 2/2017 | Mandai | |
| 2017/0170033 A1* | 6/2017 | Okabe | H01L 21/67017 |
| 2017/0170042 A1* | 6/2017 | Okabe | H01L 21/67393 |
| 2018/0114710 A1 | 4/2018 | Jeong | |
| 2018/0124960 A1 | 5/2018 | Vincent | |
| 2018/0130684 A1 | 5/2018 | Reuter | |
| 2018/0130685 A1 | 5/2018 | Bonecutter | |
| 2018/0130686 A1 | 5/2018 | Blahnik | |
| 2018/0130687 A1 | 5/2018 | Bonecutter | |
| 2018/0226284 A1 | 8/2018 | Blahnik | |
| 2018/0269095 A1 | 9/2018 | Reuter | |
| 2018/0277410 A1 | 9/2018 | Woo | |
| 2018/0374725 A1 | 12/2018 | Holeyannavar | |
| 2018/0374733 A1 | 12/2018 | Pannese | |
| 2019/0267258 A1 | 8/2019 | Rice | |
| 2019/0267266 A1 | 8/2019 | Holeyannavar | |
| 2019/0341282 A1* | 11/2019 | Kim | H01L 21/67242 |
| 2021/0043479 A1 | 2/2021 | Holeyannavar | |

FOREIGN PATENT DOCUMENTS

| | | |
|---|---|---|
| JP | 11154699 A | 6/1999 |
| JP | 2004509454 A | 3/2004 |
| JP | 2005033118 A | 2/2005 |
| JP | 2009538000 A | 10/2009 |
| JP | 2015531546 A | 11/2015 |
| JP | 2017063215 A | 3/2017 |
| KR | 970018335 A | 4/1997 |
| KR | 20030006683 A | 1/2003 |
| KR | 20030037579 A | 5/2003 |
| KR | 10-2014-0057862 A | 5/2014 |
| KR | 10-2015-0087015 A | 7/2015 |
| KR | 20150083216 A | 7/2015 |
| KR | 20150087067 A | 7/2015 |
| KR | 20160114547 A | 10/2016 |
| KR | 10-2017-0037294 A | 4/2017 |
| KR | 200483073 Y1 | 4/2017 |
| WO | 0109020 A1 | 2/2001 |

OTHER PUBLICATIONS

International Search Report and Written Opinion of international Application No. PCT/US2018/034622 (24710-WO) dated Sep. 19, 2018.

International Search Report and Written Opinion of international Application No. PCT/US2018/034635 (25135-WO) dated Sep. 14, 2018.

Chinese Search Report received for Chinese Application No. 201880040461.8 dated Sep. 23, 2020.

Chinese Office Action received for Chinese Application No. 201880040461.8 dated Mar. 30, 2021.

Taiwan Search Report of Taiwan Application No. 109137351 dated Sep. 10, 2021.

Taiwan Search Report for Taiwan Application No. 111104231 dated Mar. 17, 2022.

Taiwan Search Report for Taiwan Application No. 107118077, mailed Mar. 6, 2019, 2 Pages.

* cited by examiner

SIDE STORAGE PODS, EQUIPMENT FRONT END MODULES, AND METHODS FOR PROCESSING SUBSTRATES

RELATED APPLICATION

This application is a continuation application of U.S. patent application Ser. No. 17/080,595, filed Oct. 26, 2020, which is a continuation of U.S. patent application Ser. No. 16/411,009, filed May 13, 2019, now U.S. Pat. No. 10,847,390, issued Nov. 24, 2020, which is a continuation application of U.S. patent application Ser. No. 15/632,074, filed Jun. 23, 2017, now U.S. Pat. No. 10,388,547, issued Aug. 20, 2019, the entire contents of which are hereby incorporated by reference.

FIELD

The present disclosure relates to electronic device manufacturing, and more specifically to side storage pods and systems and methods for processing substrates.

BACKGROUND

Electronic device manufacturing systems may include multiple process chambers arranged around a mainframe housing having a transfer chamber and one or more load lock chambers configured to pass substrates into the transfer chamber. These systems may employ a transfer robot, which may be housed in the transfer chamber, for example. The transfer robot may be a selectively compliant articulated robot arm (SCARA) robot or the like, and may be adapted to transport substrates between the various chambers and one or more load lock chambers. For example, the transfer robot may transport substrates from process chamber to process chamber, from load lock chamber to process chamber, and vice versa.

Processing of substrates in semi-conductor component manufacturing may be carried out in multiple tools, where the substrates travel between the tools in substrate carriers (e.g., front end unified pods or FOUPs). Exposure of the substrates to certain environmental conditions during processing may damage the substrates. For example, exposure to humidity during processing of substrates may form acids on the substrates, which may degrade or destroy components fabricated onto the substrates.

Accordingly, improved systems, apparatus, and methods for controlling the environmental conditions of substrates during processing are desired.

SUMMARY

In one aspect, a side storage pod is provided. The side storage pod includes a first chamber configured to receive a side storage container; a panel having a panel first side, a panel second side, and a panel opening extending between the panel first side and the panel second side, the panel first side configured to be coupled to the first chamber, wherein the panel opening is adjacent the first chamber, the panel second side configured to be coupled to an equipment front end module; a side storage container received in the first chamber, the side storage container having a plurality of vertically-spaced substrate holders each configured to support a substrate; and an exhaust conduit configured to be coupled to the side storage container received and extending to an exterior of the first chamber.

In another aspect, an electronic device processing system is provided. The electronic device processing system includes an equipment front end module including an equipment front end module chamber having one or more interface openings; a side storage pod having one or more chambers, each of the one or more chambers configured to receive a side storage container and each of the one or more chambers comprising: a panel opening located adjacent to an interface opening of the one or more interface openings; an interior door having an open state wherein gas flow through the interface opening and the panel opening is enabled and a closed state wherein gas flow through the interface opening and the panel opening is disabled; and an exhaust conduit configured to be coupled to a side storage container received in the one or more chambers.

In yet another aspect, a side storage container is provided. The side storage container includes an interior configured to receive one or more substrates; a pod opening wherein the one or more substrates are receivable to the interior by way of the pod opening; an exhaust duct coupled to the interior; and an exhaust port coupled to the exhaust duct; wherein the pod opening is configured to be aligned with a panel opening in a panel coupled to the side storage container, and wherein an interior door is receivable in the panel opening.

Numerous other aspects are provided in accordance with these and other embodiments of the disclosure. Other features and aspects of embodiments of the disclosure will become more fully apparent from the following detailed description, the appended claims, and the accompanying drawings.

BRIEF DESCRIPTION OF THE FIGURES

The drawings, described below, are for illustrative purposes and are not necessarily drawn to scale. The drawings are not intended to limit the scope of the disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Electronic device manufacturing may involve very precise processing, as well as rapid transport of substrates between various locations. In particular, existing systems may transfer substrates between substrate carriers and load locks and then into processing chambers and vice versa. However, there may be periods during processing when the substrates may sit idle while waiting for processing or after processing. During these idle periods, the substrates may be exposed to relatively high humidity, high oxygen ($O_2$) levels, and/or other environmental conditions that may adversely affect the substrates.

According to one or more embodiments of the disclosure, electronic device processing systems and methods adapted to provide improved substrate processing are provided. The systems and methods described herein may provide efficiency and/or processing improvements in the processing of substrates by controlling environmental exposure of the substrates, and, in particular, conditions within a side storage pod coupled to an EFEM. One or more side storage containers are configured to be receivable within a side storage pod and include substrate holders (e.g., shelves) that receive substrates during processing periods, such as during idle periods before and/or after substrate processing. Gas may flow from the EFEM and into a side storage container where it flows past the substrates. Accordingly, the substrates are exposed to the gas within the EFEM, which may have certain environmental conditions, such as being relatively dry and/or having relatively low $O_2$ levels. The gas is exhausted from the side storage container after having passed by the substrates.

Further details of example embodiments of side storage pods, systems including a side storage pod, and methods of processing substrates in a side storage pod are described with reference to FIGS. 1-7 herein.

Figure 1:
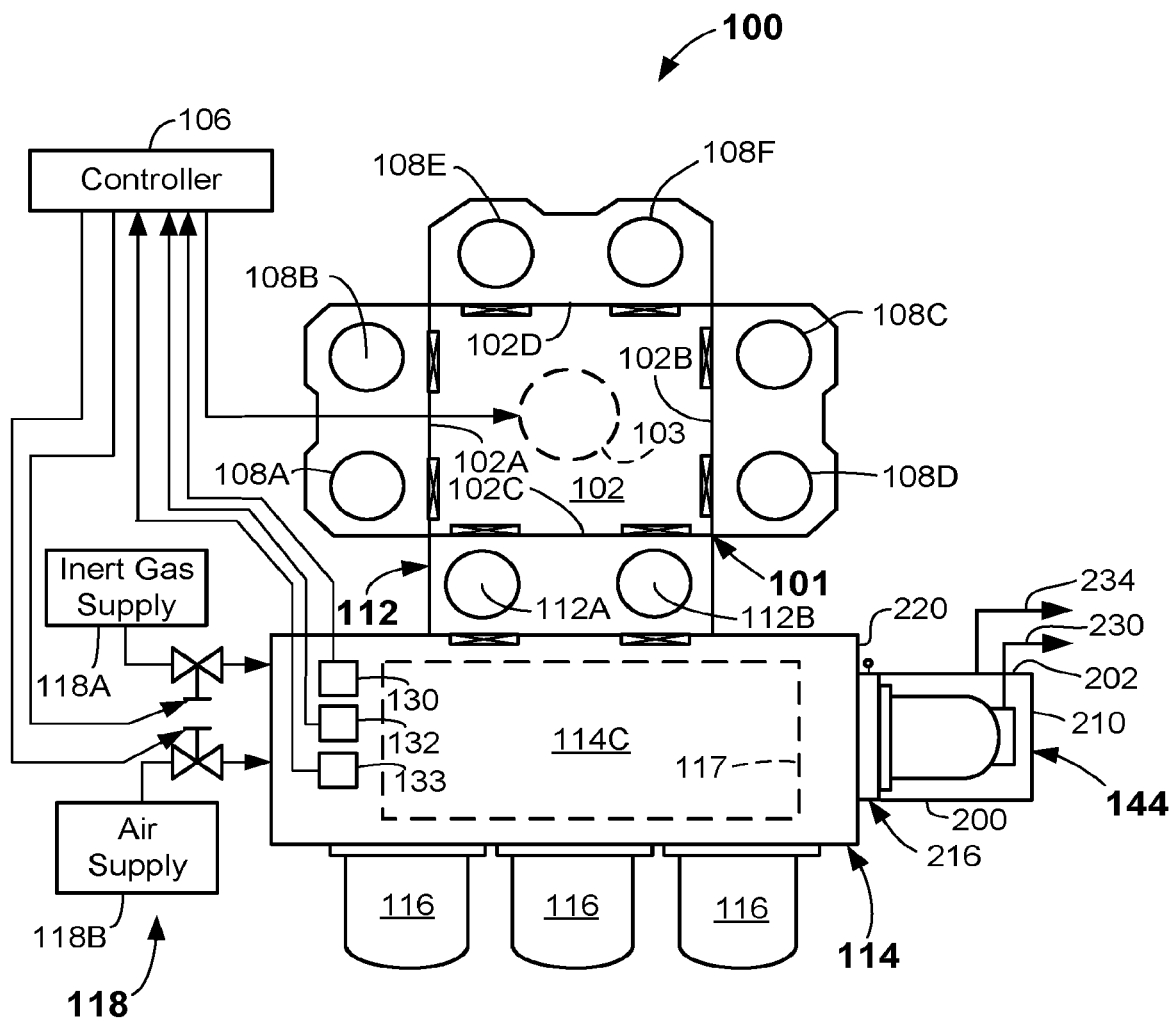
FIG. 1 illustrates a schematic top view of an electronic device processing system including a side storage pod according to embodiments.

FIG. 1 illustrates a schematic diagram of an example embodiment of an electronic device processing system 100 according to one or more embodiments of the present disclosure. The electronic device processing system 100 may include a mainframe housing 101 having housing walls defining a transfer chamber 102. A transfer robot 103 (shown as a dotted circle) may be at least partially housed within the transfer chamber 102. The transfer robot 103 may be configured to place and extract substrates to and from destinations via operation of arms (not shown) of the transfer robot 103. Substrates as used herein may mean articles used to make electronic devices or circuit components, such as semiconductor wafers, silicon-containing wafers, patterned wafers, glass plates, or the like.

The motion of the various arm components of the transfer robot 103 may be controlled by suitable commands to a drive assembly (not shown) containing a plurality of drive motors of the transfer robot 103 as commanded from a controller 106. Signals from the controller 106 may cause motion of the various components of the transfer robot 103. Suitable feedback mechanisms may be provided for one or more of the components by various sensors, such as position encoders, or the like.

The transfer robot 103 may include arms rotatable about a shoulder axis, which may be approximately centrally located in the transfer chamber 102. Transfer robot 103 may include a base that is configured to be attached to a housing wall (e.g., a floor) forming a lower portion of the transfer chamber 102. However, the transfer robot 103 may be attached to a ceiling in some embodiments. The transfer robot 103 may be a dual-type robot configured to service twin chambers (e.g., side-by-side chambers) when the tool includes twinned-process chambers (as shown). Other types of process chamber orientations, as well as transfer robots may be used.

The transfer chamber 102 in the depicted embodiment may be square or slightly rectangular in shape and may include a first facet 102A, second facet 102B opposite the first facet 102A, a third facet 102C, and a fourth facet 102D opposite the third facet 102C. The transfer robot 103 may be preferably adept at transferring and/or retracting dual substrates at a same time into the chamber sets. The first facet 102A, second facet 102B, a third facet 102C, and fourth facet 102D may be planar and entryways into the chamber sets may lie along the respective facets. However, other suitable shapes of the mainframe housing 101 and numbers of facets and processing chambers are possible.

The destinations for the transfer robot 103 may be a first process chamber set 108A, 108B, coupled to the first facet 102A and which may be configured and operable to carry out a process on the substrates delivered thereto. The process may be any suitable process such as plasma vapor deposition (PVD) or chemical vapor deposition (CVD), etch, annealing, pre-clean, metal or metal oxide removal, or the like. Other processes may be carried out on substrates therein.

The destinations for the transfer robot 103 may also be a second process chamber set 108C, 108D that may be opposed from the first process chamber set 108A, 108B. The second process chamber set 108C, 108D may be coupled to the second facet 102B and may be configured to carry out any suitable process on the substrates, such as any of the processes mentioned above. Likewise, the destinations for the transfer robot 103 may also be a third process chamber set 108E, 108F that may be opposed from the load lock apparatus 112 coupled to the third facet 102C. The third process chamber set 108E, 108F may be configured to carry out any suitable process on the substrates, such as any of the processes mentioned above.

Substrates may be received into the transfer chamber 102 from an EFEM 114, and also exit the transfer chamber 102, to the EFEM 114, through the load lock apparatus 112 that is coupled to a surface (e.g., a rear wall) of the EFEM 114. The load lock apparatus 112 may include one or more load lock chambers (e.g., load lock chambers 112A, 112B, for example). Load lock chambers 112A, 112B that are included in the load lock apparatus 112 may be single wafer load locks (SWLL) chambers, multi-wafer chambers, or combinations thereof.

The EFEM 114 may be any enclosure having sidewall surfaces (such as front, rear, and side walls, a top, and a bottom, for example) forming an EFEM chamber 114C. One or more load ports may be provided on surfaces (e.g., front surfaces) of the EFEM 114 and may be configured to receive one or more substrate carriers 116 (e.g., FOUPs) thereat. Three substrate carriers 116 are shown, but more or less numbers of substrate carriers 116 may be docked with the EFEM 114.

EFEM 114 may include a suitable load/unload robot 117 (shown dotted) of conventional construction within the EFEM chamber 114C thereof. The load/unload robot 117 may be configured and operational, once a door of a substrate carrier 116 is opened, to extract substrates from the substrate carrier 116 and feed the substrates through the EFEM chamber 114C and into the one or more load lock chambers 112A, 112B of the load lock apparatus 112. Optionally, the load/unload robot 117 may be configured and operational, once the doors of a substrate carrier 116 is opened, to extract substrates from the substrate carrier 116 and feed the substrates into a side storage pod 144 while they sit idle awaiting processing. The side storage pod 144 is coupled to a side wall of the EFEM 114. The load/unload robot 117 may further be configured to extract substrates from and load substrates into the side storage pod 144 prior to and after processing in one or more of the process chambers 108A-108F. In some embodiments, the load/unload robot 117 is a high-Z robot configured to access substrates stacked greater than 26 high, or even fifty-two high or higher, in the side storage pod 144. Any suitable construction of the load lock apparatus 112 allowing transfer of substrates between the transfer chamber 102 and the EFEM chamber 114C may be used.

In the depicted embodiment, the EFEM chamber 114C may be provided with environmental controls providing an environmentally-controlled atmosphere therein. In particular, an environmental control system 118 is coupled to the EFEM 114 and is operational to monitor and/or control environmental conditions within the EFEM chamber 114C. In some embodiments, and at certain times, the EFEM chamber 114C may receive an inert and/or non-reactive gas therein, such as Argon (Ar), Nitrogen ($N_2$), or helium (He), from an inert gas supply 118A. In other embodiments, or at other times, air (e.g., dry filtered air) may be provided from an air supply 118B. The environmental conditions within the EFEM chamber 114C may be present in the interiors of side storage containers (310 and 312, FIG. 3A) located within and as part of the side storage pod 144.

In more detail, the environmental control system 118 may control at least one of: 1) relative humidity (RH), 2) temperature (T), 3) an amount of 02, or 4) an amount of inert gas, within the EFEM chamber 114C. Other environmental conditions of the EFEM 114 may be monitored and/or controlled, such as gas flow rate into the EFEM chamber 114C, or pressure in the EFEM chamber 114C, or both.

In some embodiments, environmental control system 118 includes the controller 106. Controller 106 may include suitable processor, memory, and electronic components for receiving inputs from various sensors and controlling one or more valves to control the environmental conditions within the EFEM chamber 114C. Environmental control system 118 may, in one or more embodiments, monitor relative humidity (RH) by sensing RH in the EFEM 114 with a relative humidity sensor 130 that is configured to sense relative humidity (RH). Any suitable type of relative humidity sensor 130 may be used, such as a capacitive-type sensor. The RH may be lowered by flowing a suitable amount of an inert gas from the inert gas supply 118A of the environmental control system 118 into the EFEM chamber 114C. As described herein, the inert and/or non-reactive gas from the inert gas supply 118A may be argon, $N_2$, helium, another non-reactive gas, or mixtures thereof. Compressed bulk inert gases having low $H_2O$ levels (e.g., purity>=99.9995%, $H_2O$<5 ppm) may be used as the inert gas supply 118A in the environmental control system 118, for example. Other $H_2O$ levels may be used.

In another aspect, the environmental control system 118 measures a relative humidity value with the relative humidity sensor 130. As discussed above, the RH may be lowered by a control signal from the controller 106 to the environmental control system 118 initiating a flow of a suitable amount of an inert and/or non-reactive gas from the inert gas supply 118A into the EFEM chamber 114C. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device processing system 100 or particular substrates exposed to the environment of the EFEM 114.

In some embodiments, the environmental control system 118 of the electronic device processing system 100 may include an air supply 118B coupled to the EFEM 114. The air supply 118B may be coupled by suitable conduits and one or more valves to the EFEM 114. The environmental control system 118 may include an oxygen sensor 132 that is configured and adapted to sense a level of oxygen (02) within the EFEM 114. In some embodiments, a control signal from the controller 106 to the environmental control system 118 initiating a flow of a suitable amount of an inert gas from the inert gas supply 118A into the EFEM chamber 114C may take place to control the level of oxygen (02) to below a threshold $O_2$ value. In one or more embodiments, the threshold $O_2$ value may be less than 50 ppm, less than 10 ppm, or even less than 5 ppm, depending upon the level of $O_2$ that is tolerable (not affecting quality) for the particular process being carried out in the electronic device processing system 100 or particular substrates exposed to the environment of the EFEM 114. The environmental control system 118 may further include a pressure sensor 133 that measures the absolute or relative pressure within the EFEM 114. In some embodiments, the controller 106 may control the amount of flow of an inert gas from the inert gas supply 118A into the EFEM chamber 114C to control the pressure in the EFEM chamber 114C. In some embodiments, the oxygen sensor 132 may sense the level of oxygen in the EFEM chamber 114C to ensure it is above a safe threshold level to allow entry into the EFEM chamber 114C.

In the depicted embodiments herein, the controller 106 may be any suitable controller having suitable processor, memory, and peripheral components adapted to receive control inputs from the various sensors (e.g., relative humidity sensor 130 and/or oxygen sensor 132) and execute a closed loop or other suitable control scheme. In one embodiment, the control scheme may change a flow rate of a gas being introduced into the EFEM 114 to achieve a predetermined environmental condition therein. In another embodiment, the control scheme may determine when to transfer substrates into the EFEM 114.

The side storage pod 144 attached to the EFEM 114 may store substrates under specific environmental conditions. For example, the side storage pod 144 may store the substrates in the same environmental conditions as are present in the EFEM chamber 114C. The side storage pod 144 may be fluidly coupled to the EFEM chamber 114C and may receive inert gas from the EFEM 114. Accordingly, substrates stored in the side storage pod 144 are exposed to the same environmental conditions as the EFEM 114. The side storage pod 144 may include exhaust conduits to exhaust gas from the side storage pod 144, which further enables the substrates stored in the side storage pod 144 to be constantly exposed to the same environmental conditions of the EFEM 114. Accordingly, control of the environment of the EFEM chamber 114C also controls the environment inside the side storage pod 144.

Figure 2A:
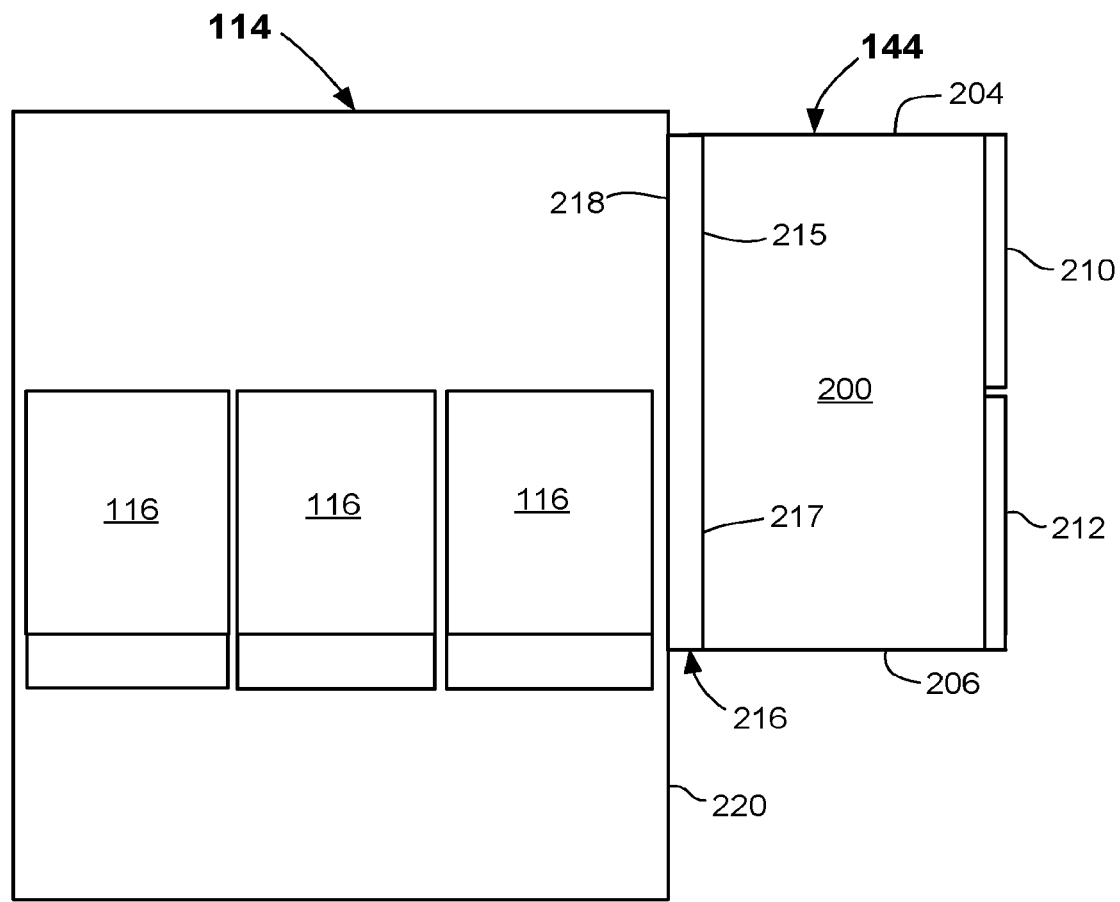
FIG. 2A illustrates a front elevation view of an equipment front end module (hereinafter "EFEM") including a side storage pod coupled to an EFEM according to embodiments.
Figure 2B:
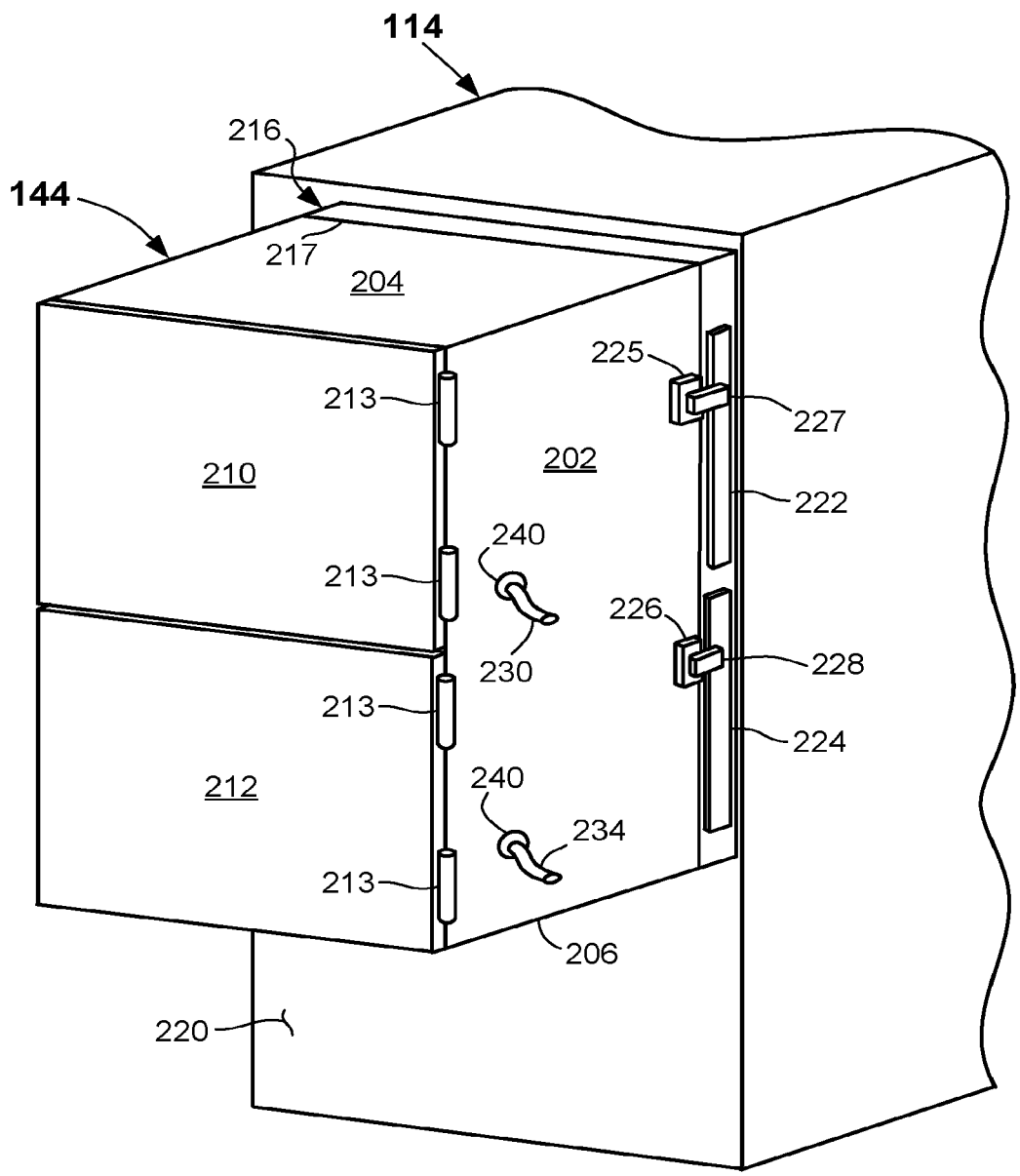
FIG. 2B illustrates an isometric view of a side storage pod coupled to an EFEM according to embodiments.

FIG. 2A illustrates a front elevation view of the EFEM 114 and a side elevation view of an embodiment the side storage pod 144. FIG. 2B illustrates an isometric view of the side storage pod 144. The side storage pod 144 depicted in FIGS. 2A and 2B includes a first wall 200, a second wall 202 located opposite the first wall 200, a top wall 204, and a bottom wall 206. A front portion of the side storage pod 144 may include an upper door 210 and a lower door 212. The upper door 210 and the lower door 212 may form a seal with the end portions of the first wall 200, the second wall 202, the top wall 204, and the bottom wall 206. The upper door 210 and the lower door 212 may be hinge-type doors including hinges 213 or removable panel doors (e.g., screwed-on sealed panel doors) that enable access to the interior of the side storage pod 144, yet sealing thereof when closed. In some embodiments, a single door may be used in place of the upper door 210 and the lower door 212. A suitable O-ring, gasket, or other seal on the upper door 210 and the lower door 212 or on the end portions may form hermetic seals of the side storage pod 144. In some embodiments, the upper door 210 may form a first sealed compartment that is separated from and separately sealable from a second sealed compartment sealed by the lower door 212. Other types of doors may be used to access the interior of the side storage pod 144.

The side storage pod 144 may have an interface side 215 located opposite the upper door 210 and the lower door 212. A panel 216 having a first side 217 and a second side 218 may be attached to the interface side 215 of the side storage pod 144. Specifically, the first side 217 of the panel 216 may be attached to the interface side 215 of the side storage pod 144. The second side 218 of the panel 216 may be attached to a surface 220 located on the exterior of the EFEM 114. The panel 216 may form a hermetically-sealed interface between the interior of the EFEM 114 and the interior of the side storage pod 144 as described below. In some embodiments, the panel 216 may be integrally formed with the side storage pod 144 or the EFEM 114.

As best shown in FIG. 2B, the side storage pod 144 may include an upper interior door 222 and a lower interior door 224 that enable or prevent gas flow between the EFEM chamber 114C of the EFEM 114 and the interior of the side storage pod 144. The upper interior door 222 and the lower interior door 224 may be panels that slide into and out of a wall (e.g., the second wall 202 as shown or another wall) and/or the panel 216 as described in greater detail below. The upper interior door 222 and the lower interior door 224 may seal the EFEM chamber 114C from the interior of the side storage pod 144 when they are in a closed state as shown in FIG. 2B. The upper interior door 222 and the lower interior door 224 may enable gas flow from the EFEM chamber 114C into the interior of the side storage containers 310, 312 (FIG. 3A) received within the side storage pod 144 when the interior doors are in an open state. Other configurations of the upper interior door 222 and the lower interior door 224 may be used in the side storage pod 144 to accomplish the selective opening and closing off of the interiors of the side storage containers 310, 312.

The side storage pod 144 may include an upper interlock device 225 and a lower interlock device 226 that engage with the upper interior door 222 and the lower interior door 224, respectively. The upper interlock device 225 may include a latch 227 that may be moveable to engage and disengage from the upper interior door 222. For example, the latch 227 may normally be in a position that prevents the upper interior door 222 from opening. When certain interlock conditions described herein are satisfied, the latch 227 may move or be moved by a user to enable the upper interior door 222 to be opened. The lower interlock device 226 may have a latch 228 that operates in the same manner as the latch 227. Other interlock devices may be used to prevent the upper interior door 222 and the lower interior door 224 from opening unless certain conditions are satisfied.

The side storage pod 144 may include an upper chamber 302 and a lower chamber 304 (FIG. 3A) located therein which contain the side storage containers 310, 312 and each of the upper chamber 302 and the lower chamber 304 may have an exhaust conduit passing therethrough. The conduits may be coupled to the side storage containers 310, 312 received within the upper chamber 302 and the lower chamber 304 to exhaust gas from within the side storage containers 310, 312. The side storage pod 144 depicted in FIGS. 2B and 3B includes an upper exhaust conduit 230 and a lower exhaust conduit 234. The upper exhaust conduit 230 and the lower exhaust conduit 234 may be coupled to quick connect members 301U, 301L (FIG. 3B) to enable the upper side storage container 310 and the lower side storage container 312 to be quickly removed or received with the respective upper chamber 302 and lower chamber 304. In some embodiments, the quick connect members 301U, 301L may each include a valve that may regulate the gas flow (e.g., a check valve or other suitable control valve) from side storage containers 310, 312 received within the side storage pod 144 and may also allow rapid disconnection therefrom. Optionally, valves configured to regulate gas flow may be located elsewhere downstream of the quick connect members 301U, 301L. The side storage pod 144 may have sealing material 240 (e.g., a grommet or other hermetic seal) located between the exhaust conduits 230, 234 and the wall (e.g., second wall 202) that prevents gas from leaking into or out of the side storage pod 144 adjacent the conduits. The exhaust conduits 230, 234 may be routed in other configurations, such as through other walls.

Figure 3A:
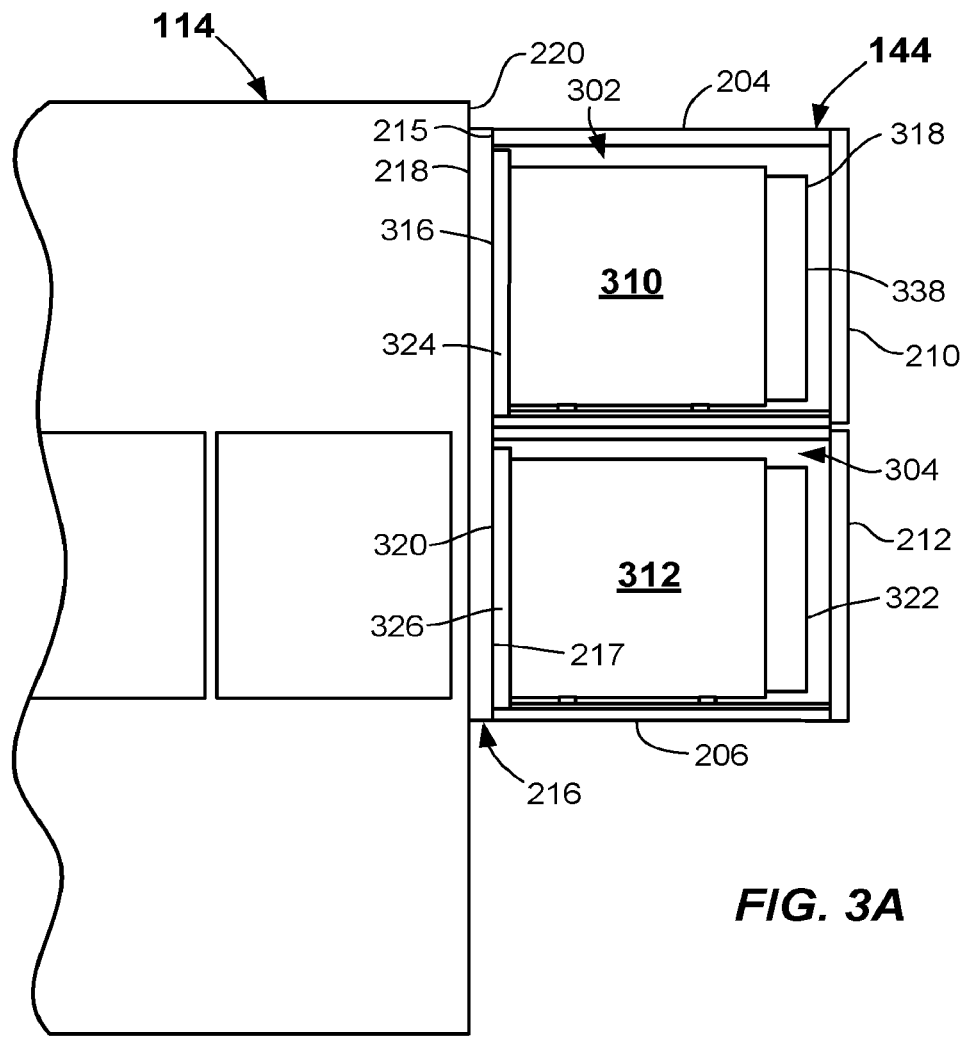
FIG. 3A illustrates a side view of a side storage pod coupled to an EFEM with a side wall of the side storage pod removed according to embodiments.
Figure 3C:
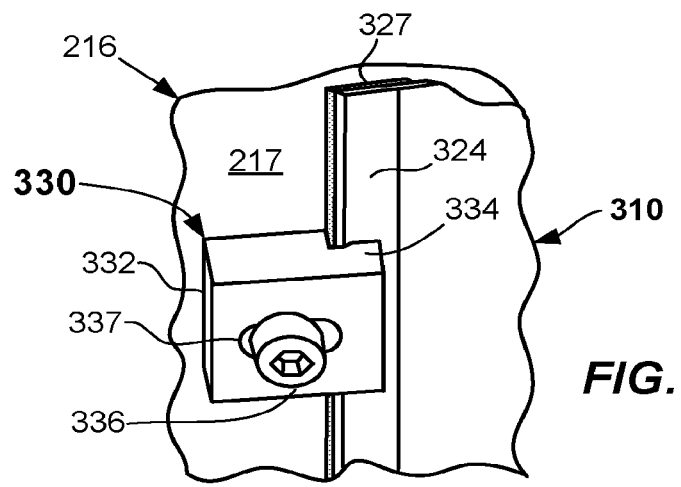
FIG. 3C illustrates a partial isometric view of a securing mechanism configured to retain a side storage container within a chamber of a side storage pod according to embodiments.
Figure 3B:
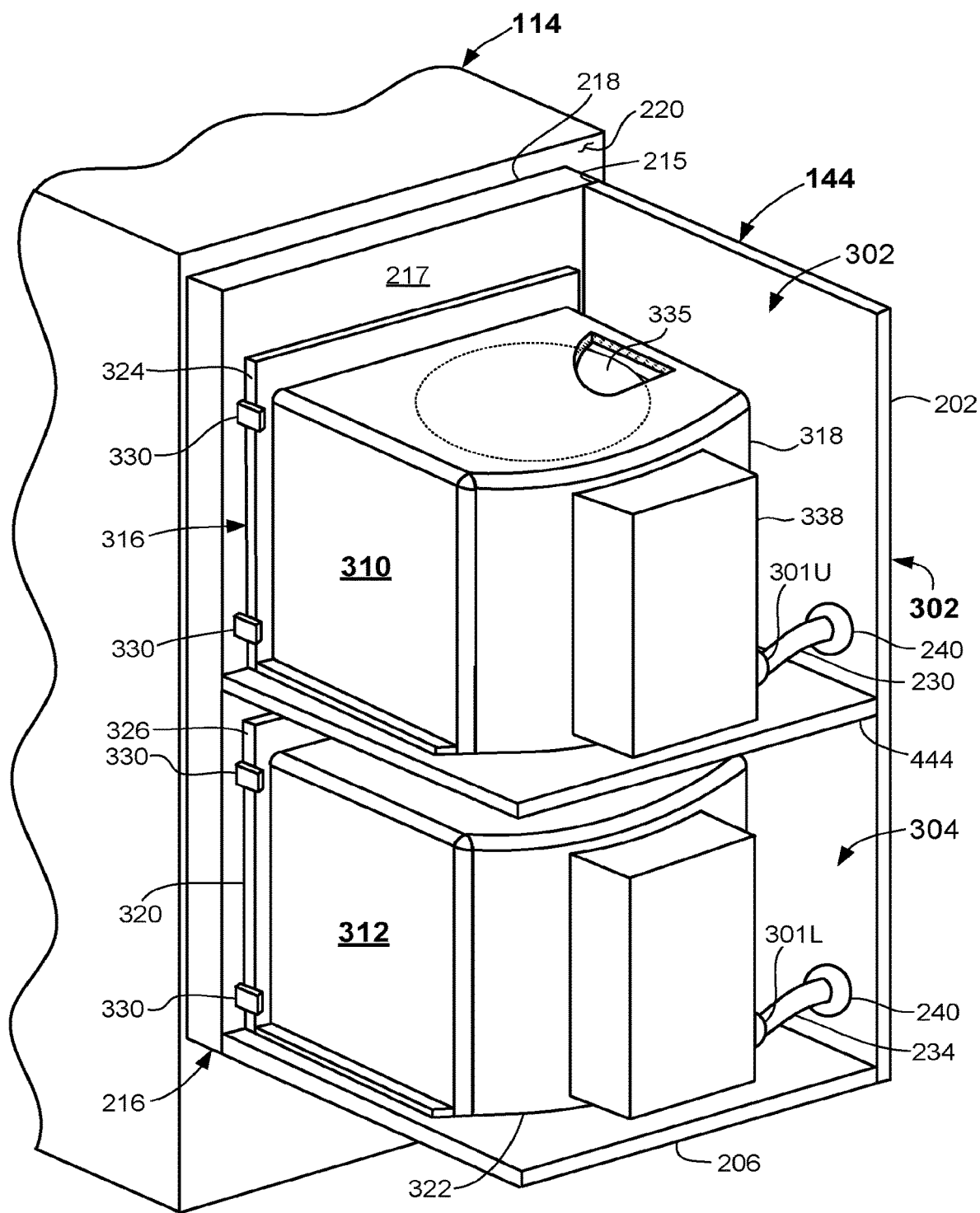
FIG. 3B illustrates a partial isometric view of a side storage pod coupled to an EFEM with a side wall, a top wall, and doors of the side storage pod removed according to embodiments.

Reference is now made to FIGS. 3A and 3B to illustrate an embodiment of the interior of the side storage pod 144. FIG. 3A illustrates a front view of the EFEM 114 and the side storage pod 144 with the first wall 200 (FIG. 2A) removed to show an embodiment of the interior of the side storage pod 144. FIG. 3B illustrates an isometric view of the side storage pod 144 with the top wall 204, the first wall 200, the upper door 210, and the lower door 212 removed to show an embodiment of the interior of the side storage pod 144.

As depicted, the side storage pod 144 includes an upper chamber 302 and a lower chamber 304. However, other embodiments of side storage pods may include a larger number of chambers, such as three or more vertically-stacked chambers. The upper chamber 302 is configured to receive the upper side storage container 310, such as via the upper door 210. The lower chamber 304 is configured to receive the lower side storage container 312, such as via the lower door 212. A plurality of substrates 335 (as shown in breakout of FIG. 3B) are transferable between the upper side storage container 310 and the EFEM 114 and the lower side storage container 312 and the EFEM 114. For example, the load/unload robot 117 may transfer substrates 335 between the EFEM 114 and the upper side storage container 310 and the lower side storage container 312 before and/or after processing in the one or more processing chambers 108A-

108F. In some embodiments, the upper side storage container 310 and the lower side storage container 312 may each receive twenty-six substrates 335. The upper side storage container 310 and the lower side storage container 312 may maintain the substrates under specific environmental conditions during their storage. For example, the substrates 335 may be exposed to an inert gas or other gas that is within the EFEM 114 as described above. The environmental conditions may be controlled to provide exposure to less than preselected thresholds of water and/or 02, or other conditions as specified above.

The upper side storage container 310 has a front portion 316 and a rear portion 318. The lower side storage container 312 has a front portion 320 and a rear portion 322. The front portion 316 of the upper side storage container 310 may have an upper flange 324 and the front portion 320 of the lower side storage container 312 may have a lower flange 326. The upper flange 324 and the lower flange 326 may have seals 327 (e.g., gaskets, O-rings, and the like—See FIG. 3C) around the periphery thereof that prevent gas from the EFEM 114, the interior of the upper side storage container 310, and the interior of the lower side storage container 312 from entering the upper chamber 302 and lower chamber 304.

The upper flange 324 of the upper side storage container 310 and the lower flange 326 of the lower side storage container 312 may be affixed (e.g., clamped) to the first side 217 of the panel 216 by way of securing mechanisms 330. Additional reference is made to FIG. 3C to illustrate an enlarged view of an embodiment of a securing mechanism 330 securing the upper flange 324 of the upper side storage container 310 to the first side 217 of the panel 216. The following description of a securing mechanism 330 is applicable to all the securing mechanisms 330. The securing mechanism 330 may include a block 332 and a lip portion 334. The lip portion 334 may be configured to engage the upper flange 324 of the upper side storage container 310. A fastener 336 may pass through a slot 337 in the block 332 and may be threaded into the panel 216. As the fastener 336 is tightened, it urges the upper flange 324 towards the first side 217 of the panel 216, which secures and seals the upper side storage container 310 to the panel 216.

The slot 337 enables the securing mechanism 330 to be moved towards and away from the upper flange 324 when the fastener 336 is loosened. This movement enables the securing mechanism 330 to engage the upper flange 324 when the upper flange 324 is in different positions relative to the panel 216. The movement further enables the securing mechanism 330 to be slid away from the upper flange 324 so as not to engage the upper flange 324 without removing the fastener 336. Accordingly, the upper side storage container 310 may be removed from the panel 216 without removing the fastener 336. Other mechanisms may be used to secure the upper side storage container 310 and the lower side storage container 312 to the panel 216. In the depicted embodiment, four securing mechanism 330 (two per side) may be used to secure each of the upper side storage container 310 and the lower side storage container 312. However, other numbers and locations of the securing mechanism 330 may be used.

The upper chamber 302 and the lower chamber 304 may be individually sealable.

Specifically, the upper chamber 302 may be sealable to prevent the exchange of gas between the interior of the upper chamber 302 and the exterior of the side storage pod 144. The interior of the upper chamber 302 may also be sealable so that there is no gas exchanged with the EFEM chamber 114C. The sealing may further prevent gas exchange between the upper chamber 302 and the lower chamber 304. However, gas may flow from the EFEM chamber 114C, into the upper side storage container 310, and out the upper exhaust conduit 230. Likewise, gas may flow from the EFEM chamber 114C, into the lower side storage container 312, and out the lower exhaust conduit 234.

Figure 4A:
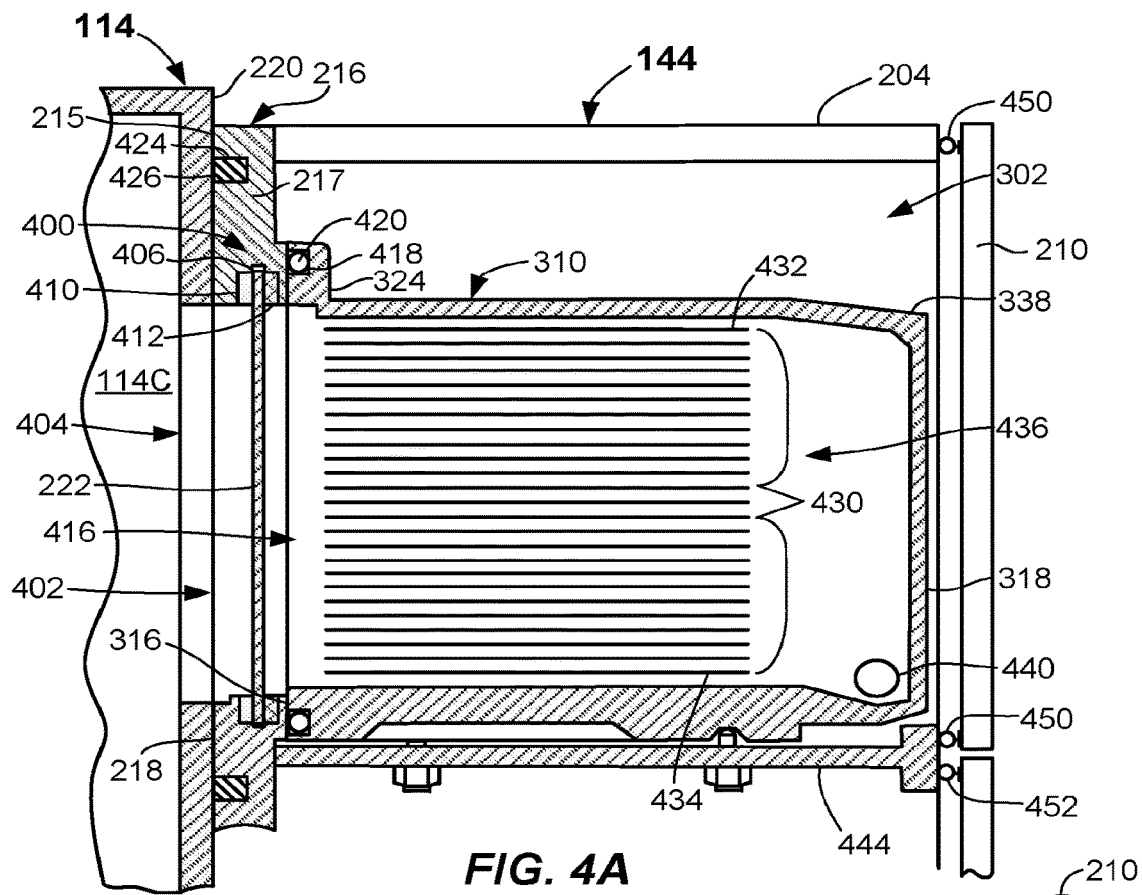
FIG. 4A illustrates a cross-sectional side view of an interface between an EFEM and a side storage pod according to embodiments.

FIG. 4A illustrates a cross-sectional side view of an embodiment of the interface between the EFEM 114 and the side storage pod 144. Specifically, FIG. 4A shows the interface between the upper side storage container 310 and the EFEM 114, which may be the same as an interface between the lower side storage container 312 (FIG. 3B) and the EFEM 114. The panel 216 includes an interface portion 400 that extends from the first side 217 to engage the front portion 316 of the upper side storage container 310. The interface portion 400 extends around the periphery of a panel opening 402 formed in the panel 216. The panel opening 402 is located adjacent to an interface opening 404 in the EFEM 114. The upper chamber 302 shown in FIG. 4A is in a closed state wherein the upper interior door 222 is in place adjacent the panel opening 402 to block gas flow between the EFEM chamber 114C and the upper side storage container 310.

The interface portion 400 may include a door recess 406 extending around the periphery of the panel opening 402 that receives the upper interior door 222, a door seal 410, and a door guide 412. In other embodiments, the upper interior door 222, the door seal 410, and the door guide 412 may be received in separate recesses. The door seal 410 may be a resilient material that prevents gas leaking past the upper interior door 222 and/or leaking past a void left when the upper interior door 222 is removed. Accordingly, the door seal 410 may prevent gas from leaking into the interior of the upper chamber 302 and also out of the side storage pod 144. The door guide 412 may be made of a material and/or construction that supports the upper interior door 222 in a predetermined location and urges the upper interior door 222 against the door seal 410. Other seals and door guides may be used in the side storage pod 144.

The upper side storage container 310 may have a pod opening 416 that is located adjacent to the panel opening 402 to form a single opening into the interior of the upper side storage container 310 when the upper interior door 222 is in the open state. The panel opening 402 may be the same approximate size as the pod opening 416. A pod recess 418 may be formed in the upper flange 324 and may extend around the periphery of the pod opening 416. A pod seal 420 may be received within the pod recess 418. The pod seal 420 prevents gas from leaking past the interface of the front portion 316 of the upper side storage container 310 and the interface portion 400 of the panel 216. The pod seal 420 may be a pliable material, such as an elastomer-based material, that contacts the pod recess 418 and the interface portion 400. In some embodiments, the pod seal 420 is a pliable tube that may deform to form a seal between the pod recess 418 and the interface portion 400. Other types of seals may be used to seal the upper side storage container 310 and the interface portion 400.

The second side 218 of the panel 216 may have a panel recess 424 formed therein that extends around the periphery of the panel opening 402. A panel seal 426 may be received within the panel recess 424 to prevent the exchange of gas between the panel 216 and the surface 220 of the EFEM 114. The panel seal 426 be a flat seal and may be made of ethylene propylene diene monomer (EPDM) rubber. In some embodiments, the panel seal 426 is about 11 mm deep and has a compression of about 5.8 mm. Other types of sealing mechanisms and materials may be used to form a seal between the surface 220 and the panel 216.

The interior of the upper side storage container 310 may include a plurality of substrate holders 430 configured to support substrates 335 (FIG. 3B) thereon. The substrate holders 430 may be vertically-stacked shelves formed onto the lateral sides of the upper side storage container 310 and may include a top substrate holder 432 and a bottom substrate holder 434. The substrate holders 430 may be spaced a distance from each other that enables gas flow around (e.g., above and below) substrates 335 received by and supported on the substrate holders 430. Specifically, gas entering the interior of the upper side storage container 310 from the EFEM chamber 114C by way of the panel opening 402, the interface opening 404, and the pod opening 416 may flow around the substrates 335 received on the substrate holders 430. Accordingly, the substrates 335 are maintained in the same environmental conditions as are present in the EFEM 114.

The rear portion 318 of the upper side storage container 310 may include an opening 436 that couples the interior of the upper side storage container 310 with an exhaust duct 338. The exhaust duct 338 may be configured to provide the above-described gas flow around the substrates 335 received on the substrate holders 430. The exhaust duct 338 may have a height that extends vertically between the top substrate holder 432 and the bottom substrate holder 434. The exhaust duct 338 may have a width that is approximately the width of the substrates 335. For example, the width may be about 250 mm to 350 mm for a 300 mm wafer. The exhaust duct 338 may include an exhaust port 440 configured to be coupled to the upper exhaust conduit 230 (FIG. 2B). Accordingly, gas flow through the interior of the upper side storage container 310 enters the pod opening 416, passes around the substrates 335 supported on the substrate holders 430, enters the exhaust duct 338 via the opening 436, and is exhausted via the exhaust port 440 and upper exhaust conduit 230. The airflow configuration enables the substrates 335 received in the substrate holders 430 to be in the same environmental conditions as the EFEM 114. In some embodiments, the exhaust port 440 is located proximate to a lower-most portion of the exhaust duct 338 as shown in FIG. 4A.

The upper side storage container 310 may set on a platform 444. Platform 444 may include securing mechanisms and leveling mechanisms coupled thereto. The lower side storage container 312 (FIG. 3A) may set on a platform identical or similar to the platform 444. In some embodiments, the platform 444 is integral with the side storage pod 144 and in other embodiments, the platform 444 is a separate unit attached to a structure within the side storage pod 144. Additional reference is now made to FIG. 5A, which shows a top plan view of an embodiment of the platform 444 and FIG. 5B, which shows a side elevation view of the platform 444. The platform 444 may include an upper surface 500 above which the upper side storage container 310 may be positioned and a lower surface 502.

The platform 444 may include a plurality of kinematic pins 508 configured to aid in leveling the upper side storage container 310. The embodiment of FIGS. 5A and 5B includes three kinematic pins 508 that extend from the upper surface 500 and engage the upper side storage container 310. Other embodiments may include three or more kinematic pins 508. In some embodiments, the heights of the engaging ends of the kinematic pins 508 are adjustable so the height from which they extend from the upper surface 500 may be adjusted. Adjustment of the height of the three kinematic pins 508 enables reorientation (e.g., leveling and/or height adjustment) of the upper side storage container 310 relative to the platform 444 and more particularly to the load/unload robot 117 in the EFEM chamber 114C. Each of the kinematic pins 508 may provide for approximately 0 mm to 5 mm, or even 0 mm to 2 mm of height adjustment. The kinematic pins 508 may be received in concave portions 545 formed in the underside of the upper side storage container 310. The kinematic pins 508 may include any suitable end shape including tapered, domed, and combinations thereof). Other devices may be used to level and/or adjust the height of the upper side storage container 310 relative to the platform 444.

The platform 444 may further include a plurality of platform sensors 514 that generate electrical signals in response to the seating of the upper side storage container 310 on the platform 444. The platform sensors 514 may be any suitable proximity sensor such as a contact sensor or non-contact sensor (e.g., a Reed sensor, Hall effect sensor, force sensitive resistor (FSR) sensor, magnetic sensor, micro-contact switch, roller lever micro switch, push button switch, and the like). The embodiment of FIGS. 5A and 5B includes three platform sensors 514, one located proximate each of the kinematic pins 508. The platform sensors 514 may be switches that change state when the upper side storage container 310 is set properly on the platform 444 and/or the kinematic pins 508. The states of the platform sensors 514 may be used to provide interlock signals to determine whether the upper interior door 222 (FIG. 4A) may be opened. Other sensor devices may be used to determine whether the upper side storage container 310 is seated properly on the platform 444.

A securing device 520 may be configured to secure the upper side storage container 310 to the platform 444. The securing device 520 depicted in FIGS. 5A and 5B may include an air cylinder 523 that urges the upper side storage container 310 toward the upper surface 500 of the platform 444. The securing device 520 may extend through a hole 522 in the platform 444. A tab 526 may engage an engagement portion 527 formed on the underside of the upper side storage container 310. The air cylinder may then force the tab 526 toward the upper surface 500, which secures the upper side storage container 310 to the platform 444. In some embodiments, the tab 526 is normally in a position to force the upper side storage container 310 toward the platform 444 and is released in response to an increase in air pressure into the securing device 520. In some embodiments, the concave portions 545 on the underside of the upper side storage container 310 are urged into contact with the engaging ends of the kinematic pins 508 as the air cylinder 523 is actuated to cause the tab 526 to exert a force on the engagement portion 527.

Referring again to FIG. 4A, a seal 450 may be positioned between the upper door 210 and walls of the upper chamber 302. Similarly, a seal 452 may be positioned between the lower door 212 and the walls of the lower chamber 304. The seal 450 and the seal 452 may serve to hermetically seal the upper door 210 to the upper chamber 302 and the lower door 212 to the lower chamber 304. The seal 450 may have the same physical configuration as the seal 452.

Figure 4B:
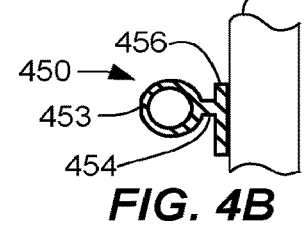
FIG. 4B illustrates a cross-sectional side view of a seal between a door and a chamber according to embodiments.

Reference is made to FIG. 4B, which illustrates an enlarged side cross sectional view of the seal 450. The seal 450 may be a bulb-type seal and may include a ring 453 that is configured to contact walls of the upper chamber 302. The contact may cause the ring 453 to compress or deform to form a hermetic seal between the walls and the upper door 210. A stem 454 may couple the ring 453 to a footing 456, which may be fastened (e.g., adhered) to the upper door 210. The seal 452 (FIG. 4A) may have the same configuration as the seal 450 and may be fastened to the lower door 212. The ring 453 may have a diameter of about 12 mm and may compress to about 6 mm. The seal 450 and the seal 452 may made from EPDM rubber. Other seal configurations and materials may be used.

Figure 6:
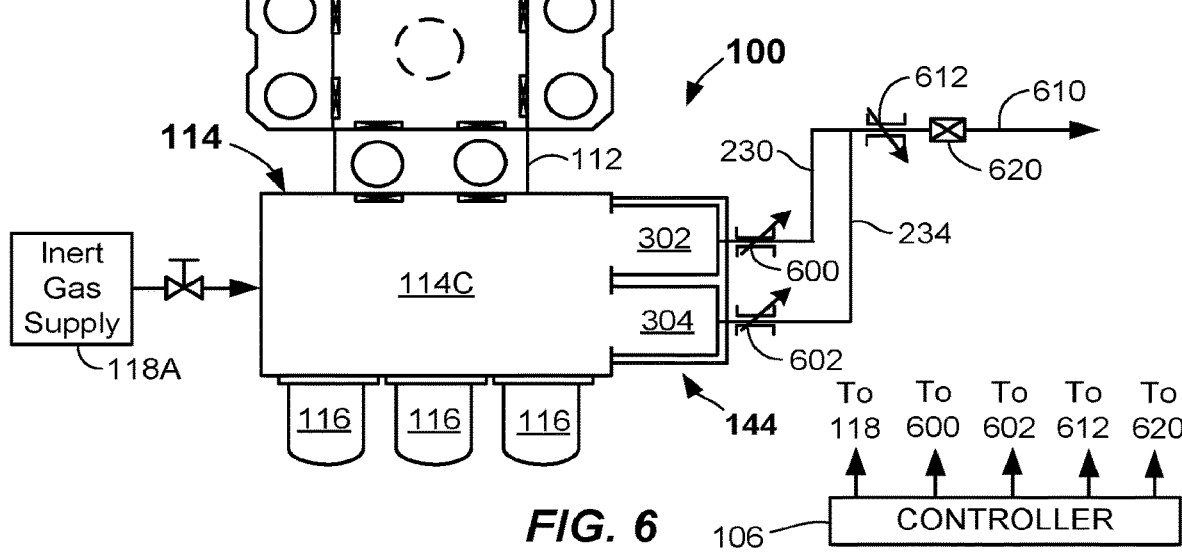
FIG. 6 illustrates a schematic diagram of exhaust conduits and exhaust control devices according to embodiments.
Figure 5A:
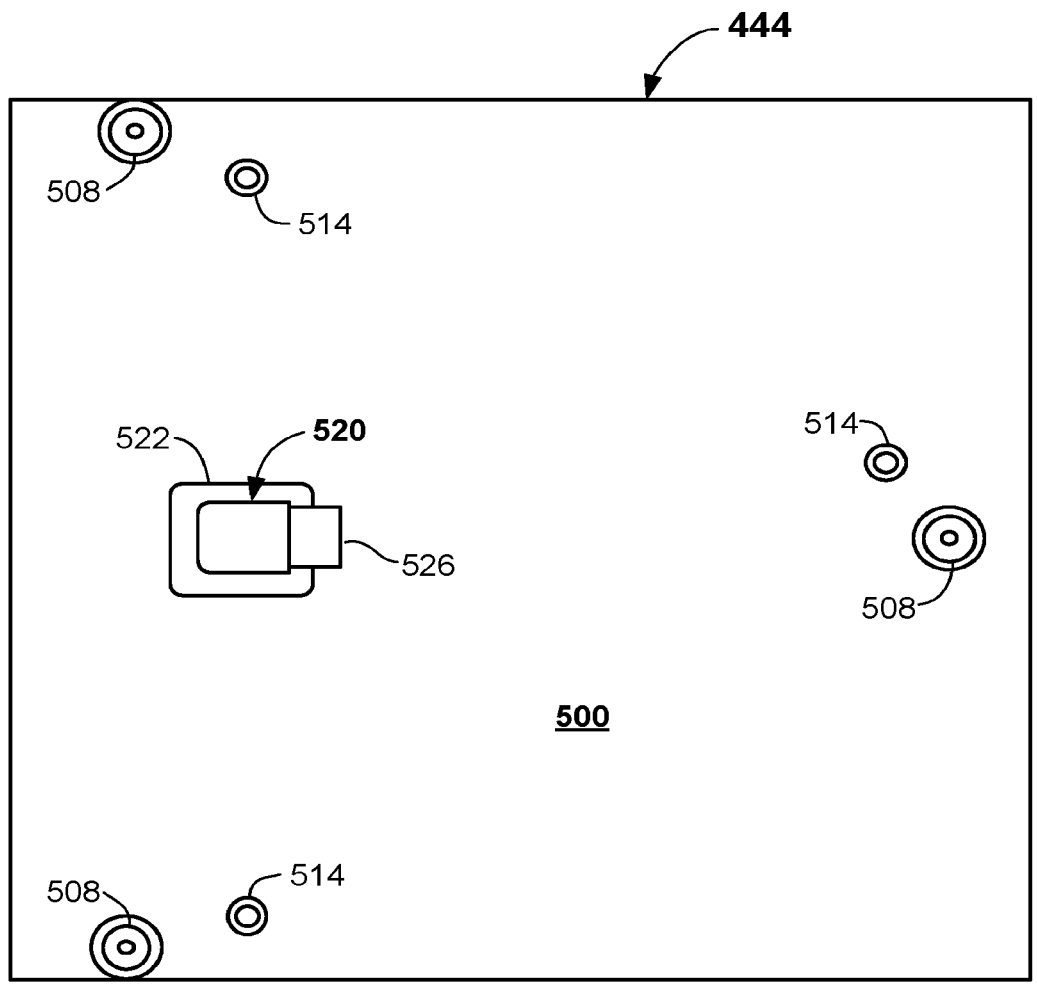
FIG. 5A illustrates a top plan view of a platform that holds a side storage container within a chamber of a side storage pod according to embodiments.
Figure 5B:
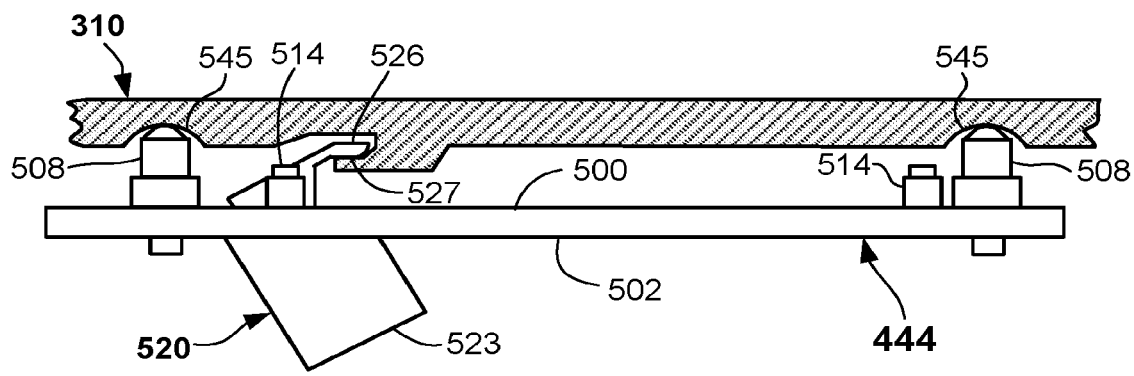
FIG. 5B illustrates a side view of the platform of FIG. 5A according to embodiments.

FIG. 6 illustrates a schematic diagram showing an embodiment of the exhaust conduits and exhaust control devices coupled thereto. FIG. 6 shows the upper chamber 302 and the lower chamber 304 located in a side-by-side orientation (as opposed to one above another) solely for illustration purposes. In the illustrated embodiment, the upper exhaust conduit 230 may include a first valve 600 coupled in series and the lower exhaust conduit 234 may have a second valve 602 coupled in series. The upper exhaust conduit 230 and the lower exhaust conduit 234 may be coupled to a main exhaust conduit 610 that may have a main valve 612 coupled in series. The first valve 600 controls gas flow through the upper exhaust conduit 230 and the second valve 602 controls gas flow through the lower exhaust conduit 234. The main valve 612 controls the gas flow through the main exhaust conduit 610. A pump 620 may be coupled to the main exhaust conduit 610 to force gas through the upper exhaust conduit 230 and the lower exhaust conduit 234. The pump 620 may be a vacuum pump that draws gas from the upper exhaust conduit 230 and the lower exhaust conduit 234 and thus from the exhaust duct 338. In some embodiments, the controller 106 (FIG. 1) sets the gas flow through the main valve 612 in conjunction with the inflow from the inert gas supply 118A to control the gas pressure within the EFEM chamber 114C. In some embodiments, the absolute pressure within the EFEM chamber 114C may be between about 1" $H_2O$ (250 pa) or to about 2.5" $H_2O$ (625 pa), for example.

The first valve 600, the second valve 602, the main valve 612 and the pump 620 may be operated by a controller, such as the controller 106. The controller 106 may open or close valves and may set the vacuum pressure of the pump 620. Other exhaust configurations and controls may be used.

Having described many of the components of the EFEM 114 and the side storage pod 144, their operation will now be described. The second side 218 of the panel 216 may be fastened to the surface 220 of the EFEM 114. The fastening causes the panel seal 426 to engage the surface 220 of a side wall of the EFEM 114 and prevent gas from leaking from the EFEM chamber 114C. The upper interior door 222 and the lower interior door 224 may be inserted into the panel 216 to prevent gas flow from the EFEM chamber 114C from entering the upper chamber 302 and the lower chamber 304. The EFEM 114 may then be operational because it is sealed from the upper chamber 302, the lower chamber 304, and the factory environment outside of the EFEM chamber 114C.

The following description describes attaching the upper side storage container 310 within the upper chamber 302 and is also applicable to attaching the lower side storage container 312 within the lower chamber 304. The upper side storage container 310 may be received into the upper chamber 302 via opening or removing upper door 210. The upper side storage container 310 may then be set proximate to the upper surface 500 of the platform 444. The kinematic pins 508 may be received within concave portions 545 formed in the underside of the upper side storage container 310. The heights of the kinematic pins 508 may be adjusted to raise, lower, and/or level the upper side storage container 310 to a horizontal plane or to a plane of an end effector of the load/unload robot 117. The upper side storage container 310 may toggle the platform sensors 514 when the upper side storage container 310 is set properly on the platform 444. The upper flange 324 may be fastened to the first side 217 of the panel 216 by way of the securing mechanisms 330. The fastening causes the pod seal 420 to engage the interface portion 400, which prevents gas from the EFEM chamber 114C from entering the upper chamber 302. The upper exhaust conduit 230 may be fastened to the exhaust port 440, such as by quick connect member 301U, and the upper door 210 may be closed. At this time, the upper door 210 is in the closed configuration and a latch (not shown) or the like may prevent unintended opening of the upper door 210.

A controller, such as the controller 106 may check certain interlocks before enabling the latch 227 to be moved and the upper interior door 222 placed in the open state. The interlocks may assure that the platform sensors 514 are in the correct state and the upper door 210 is closed and/or latched. Other interlock devices may assure that the upper side storage container 310 is adjacent the first side 217 of the panel 216 and the panel 216 is located adjacent the surface 220 of the EFEM 114. Other interlock devices may assure that the upper exhaust conduit 230 is coupled to the quick connect member 301U. More, less, or different interlock conditions may be used. When all interlock conditions have been satisfied, the latch 227 may move or otherwise release to enable the upper interior door 222 to be removed. At this time or prior to this time, the controller 106 may open the first valve 600 and the main valve 612 and may cause the pump 620 to operate. Likewise, inert gas supply 118A may begin to supply inert gas to the EFEM chamber 114C. In some embodiments, removal of the upper interior door 222 may cause the upper door 210 to lock so that it may not be opened when the upper interior door 222 is in the open state.

The load/unload robot 117 may move substrates 335 into and out of the substrate holders 430. The load/unload robot 117 may be a high-Z robot having vertical access high and low enough to access substrates in the top substrate holder 432 of the upper side storage container 310 and the bottom substrate holder 434 of the lower side storage container 312. In some embodiments, the substrates 335 are placed in the upper side storage container 310 and the lower side storage container 312 during idle periods of the processing.

Gas from the EFEM chamber 114C flows through the interface opening 404, the panel opening 402, and the pod opening 416 and into the interior of the upper side storage container 310. Accordingly, substrates 335 received on the substrate holders 430 are exposed to the environmental conditions of the EFEM 114, which are set by the controller 106 as described above. The gas continues to flow into the exhaust duct 338 and out the exhaust port 440. The gas is exhausted through the upper exhaust conduit 230 and to the main exhaust conduit 610 by way of at least the pump 620. In some embodiments, the gas passing the substrates 335 may become contaminated after contact with the substrates 335, so the gas may not be recycled back into the EFEM 114, but may flow to a suitable scrubber.

At some time, either the upper side storage container 310, the lower side storage container 312, or both, may be removed, such as for cleaning. The following description describes removal of the upper side storage container 310 and is also applicable to removal of the lower side storage container 312. The upper interior door 222 may be replaced within the panel 216, which prevents gas flow from the EFEM 114 into the interior of the upper side storage container 310. Other evacuation techniques may be used to remove residual gas from the upper side storage container 310. The first valve 600 in series with the upper exhaust conduit 230 may be closed. Replacement of the upper interior door 222 may enable the upper door 210 to be opened. The upper exhaust conduit 230 may be released from the quick connect member 301U and the securing mechanisms 330 may be released from the upper flange 324. The securing device 520 may be actuated to release the tab 526 and the upper side storage container 310 may be removed from the upper chamber 302. During the time the upper side storage container 310 is removed from the upper chamber 302, the latch 227 may be engaged to prevent the upper interior door 222 from being opened. For example, the latch 227 may engage the upper interior door 222 in response to the upper door 210 opening.

The EFEM 114 may continue to operate during the removal and replacement of the upper side storage container 310. Specifically, the upper interior door 222 remains in place, which hermetically seals the EFEM 114 from the interior of the upper chamber 302. Likewise, the upper side storage container 310 may be operable and accessed by the load/unload robot 117 during removal and replacement of the lower side storage container 312.

Figure 7:
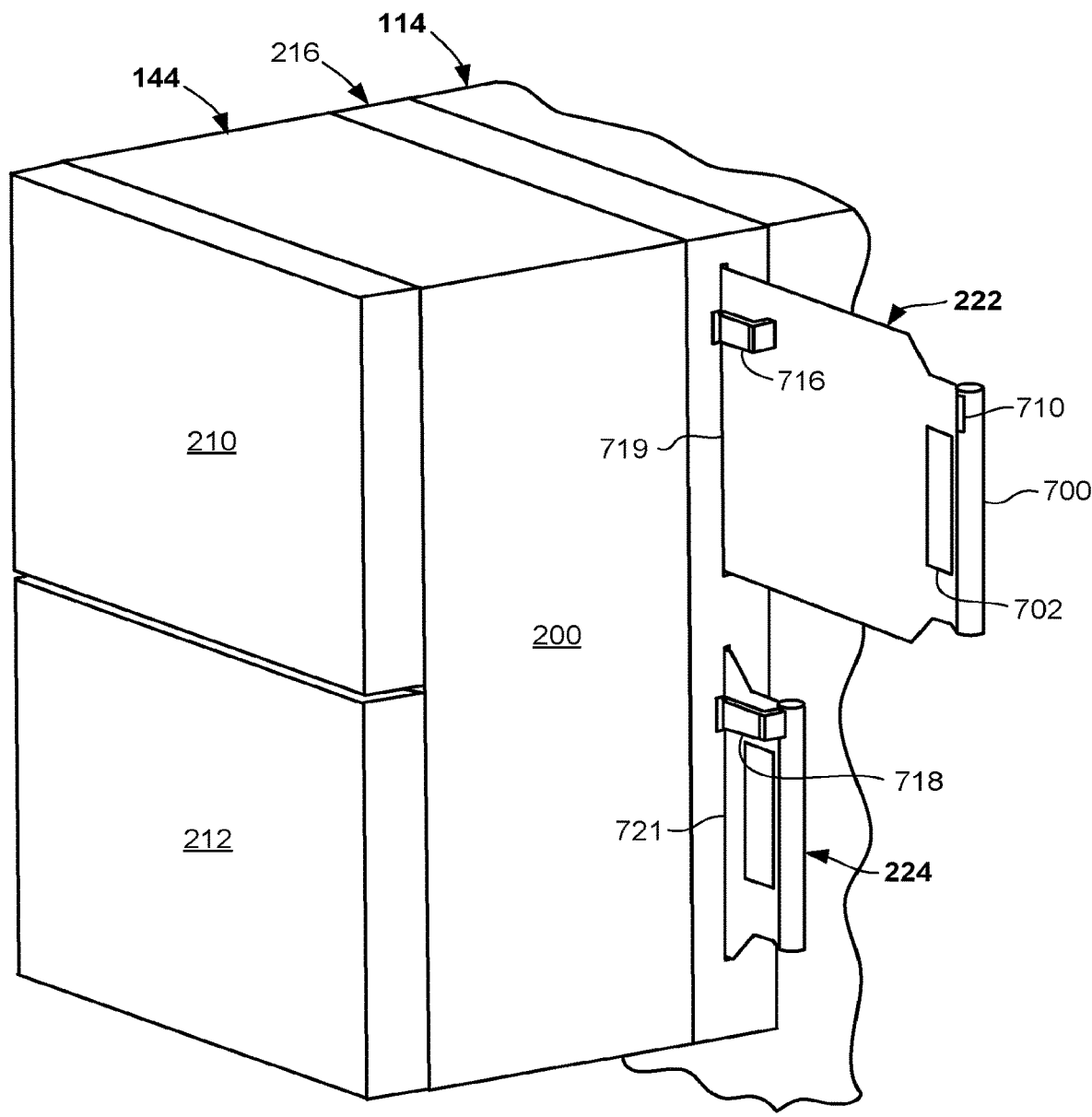
FIG. 7 illustrates an isometric view of a side storage pod coupled to an EFEM with an upper interior door in an open state and a lower interior door in a closed state according to embodiments.

Reference is now made to FIG. 7, which illustrates an isometric view of another embodiment of the side storage pod 144 coupled to an EFEM 114 with an upper interior door 222 in a partially open state and a lower interior door 224 in a closed state. Reference is made to the upper interior door 222, which may be identical to the lower interior door 224. The upper interior door 222 may include a handle 700 and an opening 702 that enable a user to grasp the upper interior door 222 and move it into and out of the panel 216.

The handle 700 may have a recess 710 located therein that receives an upper latch 716 to prevent the upper interior door 222 from being removed from the panel 216 unless certain interlock conditions are satisfied. The side storage pod 144 may include a lower latch 718 that is receivable in a similar recess (not shown) on the lower interior door 224. The lower latch 718 depicted in FIG. 7 is received in a recess in the lower interior door 224, so the lower interior door is prevented from being removed from the panel 216 and is locked in a closed state. The upper latch 716 is not received in the recess 710, so the upper interior door 222 is in an open state and may be removed from the panel 216. Upon removal of the upper interior door 222, the port 719 is resealed by the door seal 410 and the door guide 412 (FIG. 4A). Similarly, in the closed state, the port 721 receiving the lower interior door 224 is sealed by the operation of the door seal 410 and the door guide 412 (FIG. 4A).

The electronic device processing system 100 described herein provides an improved buffer station for substrates 335 to be stored during idle periods in the processing. Specifically, the substrates 335 may be placed into the upper side storage container 310 and the lower side storage container 312 during such idle periods. While the substrates 335 are stored, they are constantly exposed to the environmental conditions of the EFEM 114, which is controlled by the controller 106. The gas from the EFEM 114 entering the interiors of the upper side storage container 310 and the lower side storage container 312 may be exhausted and not returned to the EFEM 114. Accordingly, if the substrates 335 release any contaminants, those contaminants are not returned to the EFEM 114.

The side storage pod 144 enables either or both the upper side storage container 310 or the lower side storage container 312 to be removed without disabling the continuing operation of the EFEM 114 or the electronic device processing system 100. For example, the upper interior door 222 may be placed in the panel 216 and retained by the upper latch 716. The upper side storage container 310 and the upper chamber 302 are thus sealed from the EFEM chamber 114C. The upper side storage container 310 may then be removed without disrupting the operation of the EFEM 114.

The foregoing description discloses example embodiments of the disclosure. Modifications of the above-disclosed apparatus, systems, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:

1. A platform of a side storage pod, the platform comprising:
   an upper surface; and
   a plurality of kinematic pins extending from the upper surface within an interior volume of a chamber of the side storage pod to engage a lower surface of a side storage container in the interior volume of the chamber to level the side storage container in the interior volume of the chamber.

2. The platform of claim 1, wherein the side storage pod comprises a plurality of walls comprising a top wall, bottom wall, and side walls, and wherein the platform is: integral with the plurality of walls; or is a separate unit coupled to at least one of the plurality of walls of the side storage pod.

3. The platform of claim 1, wherein each of the plurality of kinematic pins is adjustable to adjust height of a distal end of a corresponding kinematic pin above the upper surface of the platform.

4. The platform of claim 1, wherein adjustment of the plurality of kinematic pins enables one or more of leveling or height adjustment of the side storage container relative to the platform and relative to a robot of an equipment front end module (EFEM), and wherein objects are to be transported by the robot from the side storage container to the EFEM via the robot.

5. The platform of claim 1, wherein each of the plurality of kinematic pins provides height adjustment of approximately 0 to 5 mm between a distal end of a corresponding kinematic pin and the upper surface of the platform, and wherein the distal end of the corresponding kinematic pin engages with the lower surface of the side storage container.

6. The platform of claim 1, wherein a corresponding distal end of each of the plurality of kinematic pins are one or more of tapered or domed to engage with a corresponding concave portion of the lower surface of the side storage container.

7. The platform of claim 1, wherein the side storage pod is configured to attach to a panel that is attached to an equipment front end module (EFEM), wherein objects are to be transported by a robot of the EFEM between the side storage container and the EFEM via an opening formed by the panel, wherein a substrate carrier is configured to removably attach to a load port that is attached to the EFEM, and wherein the objects are to be transported by the robot between the substrate carrier and the EFEM.

8. The platform of claim 1, wherein an exhaust conduit is coupled to the side storage container to exhaust gas from the side storage container to an exterior of the side storage pod.

9. The platform of claim 1 further comprising a plurality of platform sensors disposed on the upper surface, wherein the plurality of platform sensors are configured to provide sensor data responsive to the side storage container being placed on the platform in the interior volume.

10. The platform of claim 9, wherein the plurality of platform sensors comprise one or more of a proximity of sensor, contact sensor, non-contact sensor, Reed sensor, Hall effect sensor, force sensitive resistor (FSR) sensor, magnetic sensor, micro-contact switch, roller lever micro switch, or push button switch.

11. The platform of claim 1, wherein a corresponding platform sensor is located on the upper surface of the platform proximate a corresponding kinematic pin of the plurality of kinematic pins, wherein the corresponding platform sensor is configured to provide sensor data responsive to the side storage container being placed on the platform in the interior volume.

12. The platform of claim 1 further comprising a securing device configured to secure the side storage container within the chamber of the side storage pod.

13. The platform of claim 12, wherein the securing device extends through a hole formed by the platform.

14. The platform of claim 12, wherein the securing device comprises an air cylinder configured to move the side storage container towards the upper surface of the platform.

15. The platform of claim 14, wherein the securing device comprises a tab that is configured to engage an engagement portion formed on an underside of the side storage container.

16. The platform of claim 15, wherein the air cylinder is configured to force the tab toward the upper surface of the platform to secure the side storage container to the platform.

17. A side storage pod configured to couple to an equipment front end module (EFEM), the side storage pod comprising:
 a plurality of walls forming an interior volume, the plurality of walls comprising a top wall, bottom wall, and side walls; and
 a platform disposed in the interior volume, the platform comprising a plurality of kinematic pins extending from an upper surface of the platform within the interior volume to engage a lower surface of a side storage container in the interior volume to level the side storage container in the interior volume.

18. The side storage pod of claim 17, wherein the platform further comprises one or more of:
 a plurality of platform sensors disposed on the upper surface, wherein the plurality of platform sensors are configured to provide sensor data responsive to the side storage container being placed on the platform; or
 a securing device configured to secure the side storage container to the platform in the interior volume of the side storage pod.

19. A method for processing substrates, the method comprising:
 adjusting one or more of a plurality of kinematic pins to be approximately level with a robot of an equipment front end module (EFEM), wherein the plurality of kinematic pins extend from an upper surface of a platform within an interior volume formed by a side storage pod; and
 engaging a lower surface of a side storage container with the plurality of kinematic pins within the interior volume to level the side storage container in the interior volume.

20. The method of claim 19 further comprising one or more of:
 receiving, from a plurality of platform sensors disposed on the upper surface, sensor data responsive to the side storage container being placed on the platform; or
 securing, via a securing device, the side storage container to the platform in the interior volume of the side storage pod.

* * * * *